United States Patent [19]

Kim

[11] Patent Number: 5,441,909
[45] Date of Patent: Aug. 15, 1995

[54] METHOD FOR CONSTRUCTING CHARGE STORAGE ELECTRODE OF SEMICONDUCTOR MEMORY DEVICE

[75] Inventor: Jae K. Kim, Kyoungkido, Rep. of Korea

[73] Assignee: Hyundai Electronics Industries Co., Ltd., Kyoungkido, Rep. of Korea

[21] Appl. No.: 175,250

[22] Filed: Dec. 29, 1993

[30] Foreign Application Priority Data

Dec. 30, 1992 [KR] Rep. of Korea ............... 1992-26890

[51] Int. Cl.$^6$ ........................................ H01L 21/8242
[52] U.S. Cl. ........................... 437/52; 437/47; 437/60; 437/919
[58] Field of Search .............. 437/47, 48, 52, 60, 437/919; 257/307, 308

[56] References Cited

U.S. PATENT DOCUMENTS

| | | | |
|---|---|---|---|
| 5,102,820 | 4/1992 | Chiba | 437/52 |
| 5,126,280 | 6/1992 | Chan et al. | 437/52 |
| 5,137,842 | 8/1992 | Chan et al. | 437/52 |
| 5,196,364 | 3/1993 | Fazam et al. | 437/52 |
| 5,223,448 | 6/1993 | Su | 437/919 |
| 5,242,852 | 7/1993 | Matsuyama et al. | 437/52 |

FOREIGN PATENT DOCUMENTS 0243342 10/1987 Japan.
009561 4/1990 Japan.

*Primary Examiner*—Tom Thomas
*Attorney, Agent, or Firm*—Spencer, Frank & Schneider

[57] ABSTRACT

A method for constructing the charge storage electrode of a semiconductor memory device. The method can minimize the cell area of the semiconductor memory device by making a contact mask in no consideration of the distance between a contact for the charge storage electrode and a gate electrode, forming the contact for the charge storage electrode by use of the contact mask, and making the contact smaller than on the mask by means of a spacer insulating film so as to secure a distance between the contact and the gate electrode. The method also maximizes the capacity of the semiconductor memory device by forming the charge storage electrode into a double or triple structure and making the distance between the neighboring charge storage electrodes shorter than in a photo developing technique. Therefore, the capacity of the semiconductor memory device is maximized, accomplishing the high integration of the semiconductor memory device in accordance with the present invention.

20 Claims, 6 Drawing Sheets

METHOD FOR CONSTRUCTING CHARGE STORAGE ELECTRODE OF SEMICONDUCTOR MEMORY DEVICE

BACKGROUND OF THE INVENTION

1. Field of the Invention

The present invention relates, in general, to a method for constructing a charge storage electrode of a semiconductor memory device in which a drain electrode and a source electrode are connected with a bit line and the charge storage electrode, respectively and, more particularly, to a method for constructing a charge storage electrode of a semiconductor memory device, capable of minimizing the cell area and maximizing the capacity of the semiconductor memory device.

2. Description of the Prior Art

In general, as the area of a unit cell is reduced according to the high integration of the semiconductor memory device, it is required that a charge storage electrode connected with a source electrode secure sufficient capacity of the semiconductor memory device, in order for the memory device to have sufficient sensitivity to the data and that a bit line be connected with the transistor.

In constructing a contact for a charge storage electrode that is connected with the source electrode and insulated from a gate electrode, the contact for the charge storage electrode has to be spaced from the gate electrode by a predetermined distance. That is, in order to construct the charge storage electrode, a contact mask for the charge storage electrode is spaced apart from the gate electrode in consideration of the misalignment tolerance and critical dimension variation that may be generated during mask work, the thickness of insulating film that formed between the charge storage electrode and the gate electrode.

The prior art relating to the construction of charge storage electrode having a dual structure will be described next with reference to FIGS. 1A to 2C wherein reference numeral 1 designates a semiconductor substrate while reference numerals 2, 3, 4, 5, 5', 6, 7, 8, 9 and 10 designate a device separation insulating film, a gate oxide film, a gate electrode, a source electrode, a drain electrode, an interlayer insulating film, a first conductive material for charge storage electrode, a sacrificial film, a second conductive material for charge storage electrode and a spacer insulating film, respectively, For convenience, the description is continued to only the step in that the charge storage electrode is formed.

Referring initially to FIG. 1A, there is, in part, illustrated one conventional construction method of charge storage electrode having a dual structure. As illustrated in this figure, one conventional charge storage electrode is constructed by firstly sectioning a semiconductor substrate 1 into an active region and a device separation region by means of a device separation insulating film 2. Then, a gate electrode 4 is formed on the active region and the device separation insulating film 2, respectively, followed by the formation of source/drain electrodes 5, 5' in the semi conductor substrate. Thereafter, over the resulting structure, there is entirely formed an interlayer insulating film 6, which is subsequently coated with a first conductive material for charge storage electrode 7 covered with a sacrificial film 8.

FIG. 1B illustrates the formation of a second conductive material for charge storage electrode 9. For this, using a contact mask for charge storage electrode (not shown), an etch process is applied to the sacrificial film 8, the first conductive material for charge storage electrode 7 and the interlayer insulating film 6 to form a contact hole on a predetermined portion of the source electrode 5. Thereafter, the second conductive material for charge storage electrode 9 is entirely deposited over the resulting structure.

Referring now to FIG. 1C, there is illustrated the one conventional method for constructing a charge storage electrode in a semiconductor memory device, continued from FIG. 1B. The second conductive material for charge storage electrode 9 is subjected to the treatment of etch to remove a predetermined portion thereof by use of another contact mask for charge storage electrode (not shown). The resulting second conductive material for charge storage electrode 9 subsequently serves as an etching barrier which is used to etch both the sacrificial film 8 and the first conductive material for charge storage electrode 7, in order to form a charge storage electrode 20 having dual structure, connected with the source electrode 5.

The above-mentioned conventional method can provide a charge storage electrode of dual structure that allows the capacity of the semiconductor memory device to increase. In constructing the charge storage electrode by use of the conventional method, however, it is restrained to diminish the contact for charge storage electrode into below some size due to the photo developing technique being used. Also, since the charge storage electrode according to the one conventional method has to be spaced out from the lower gate electrodes 4 by a predetermined distance, the area of the charge storage electrode contact can not be reduced. Accordingly, there are many problems in fabricating a highly integrated semiconductor memory device with the one conventional method.

Turning now to FIGS. 2A through 2C, there is illustrated another conventional construction process for forming a charge storage electrode a semiconductor memory device. This conventional charge storage electrode structure adopts a spacer insulating film at the side wall of the charge storage electrode contact, in order to reduce the area of the charge storage electrode contact. However, the first conductive material for the charge storage electrode is disconnected from the second conductive material due to the spacer insulating film, so that the charge storage electrode is not formed into a dual structure.

In detail, a semiconductor substrate 1 is sectioned into an active region and a device separation region by means of a device separation insulating film 2, as shown in FIG. 2A. Thereafter, a gate electrode 4 is formed on the active region and the device separation region, respectively and source/drain electrodes 5, 5' are formed in the active region. Over the resulting structure, there is entirely formed an interlayer insulating film 6 in a predetermined thickness, which is then coated with a first conductive material for charge storage electrode 7 covered with a sacrificial film 8. Using a contact mask for charge storage electrode (not shown), an etch process is applied to the sacrificial film 8, the first conductive material for charge storage electrode 7 and the interlayer insulating film 6, in due order, in order to form a contact hole for charge storage electrode on the source electrode 5. Thereafter, a spacer film 10 is formed at the side wall of the contact hole for the charge storage electrode 7.

At this time, as the sacrificial film 8, there is employed those that show large values of etching selection ratio in relation to the spacer insulating film 10 formed at the side wall of the contact hole of charge storage electrode. For example, while the spacer insulating film 10 is normally an undoped silicate glass (hereinafter "USG"), the sacrificial film 8 is either a phospho-silicate glass (hereinafter "PSG") film or a boro-phospho-silicate glass (hereinafter "BPSG") film. The etching selection ratio of USG film to PSG (or BPSG) film is at least 10:1 in a solution containing HF and $H_2O$ or in a solution containing $NH_4OH$, $H_2O_2$ and $H_2O$.

The spacer insulating film 10 serves not only to reduce the size of the contact for charge storage electrode, but also to make the contact for charge storage electrode be spaced apart from the gate electrodes by a predetermined distance, attributing to diminishing the area of the cell.

As shown in FIG. 2B, a second conductive material for charge storage electrode 9 is formed over the sacrificial film 8 and in the contact hole, so that it is connected with the source electrode 5. In the meanwhile, the second conductive material for charge storage electrode 9 is insulated from the first conductive material for charge storage electrode 7 by the spacer insulating film 10 formed at the side wall of the contact hole.

Finally, as shown in FIG. 2C, the second conductive material for charge storage electrode 9 is subjected to the treatment of etch to remove a predetermined portion thereof by use of another contact mask for charge storage electrode (not shown). The resulting second conductive material for charge storage electrode 9 subsequently serves as an etching barrier which is used for etching both the sacrificial film 8 and the first conductive material for charge storage electrode 7, in order to form a charge storage electrode 20.

As briefly mentioned above, another conventional method for the construction of charge storage electrode is characterized by forming a spacer insulating film at the side wall of the contact for the charge storage electrode, in order to reduce the area of the cell, thereby performing high integration of the semiconductor memory device. According to the conventional method, there is provided a charge storage electrode diminished in the area of contact for the charge storage electrode, thus attributing to reducing the area of the cell. In this conventional method, however, the first conductive material for the charge storage electrode is disconnected from the second conductive material for charge storage electrode by the spacer insulating film, causing the charge storage electrode not to have a dual structure. Therefore, it is difficult to sufficiently secure the capacity of the semiconductor memory device employing the charge storage electrode constructed by the conventional method.

SUMMARY OF THE INVENTION

For solving the aforementioned problems, the present inventors have recognized that there exists a need for a method for constructing charge storage electrodes of a semiconductor memory device, whereby the semiconductor memory device can be highly integrated and be permitted to have large capacity.

Therefore, it is an object of the invention to provide a method for constructing charge storage electrodes of a semiconductor memory device which are capable of having a maximized surface.

It is another object to provide a method for constructing charge storage electrodes of a semiconductor memory device, allows a remarkable reduction in the cell area.

It is further an object to provide a method for constructing charge storage electrodes of a semiconductor memory device which are capable of having the tolerance for mask processes.

In accordance with an aspect of the present invention, the above objects can be accomplished by providing a method for constructing charge storage electrodes of a semiconductor memory device wherein a gate electrode atop a gate oxide film is formed over a semiconductor substrate sectioned by a device separation insulating film, which semiconductor substrate has, therein, a source electrode and a drain electrode that are to be connected with a charge storage electrode and a bit line, respectively. The method comprises the steps of: forming an interlayer insulating film covered with a sacrificial film entirely over the gate electrode and the resulting semiconductor substrate; applying a selective etching to the sacrificial film atop the interlayer insulating film and to the interlayer insulating film with the aid of a contact mask for the charge storage electrode so as to form on a predetermined portion of the source electrode a contact hole for the charge storage electrode exposing the source electrode therethrough; forming a spacer insulating film at the side wall of the contact hole for the charge storage electrode, so as to reduce the size of the contact hole; forming a first conductive material for the charge storage electrode on the sacrificial film and in the contact hole, the first conductive material for the charge storage electrode being connected with the source electrode through the contact hole for the charge storage electrode; applying an etching to the first conductive material for the charge storage electrode to pattern the first conductive material for charge storage electrode on a shape with the aid of a mask for the charge storage electrode; etching the sacrificial film completely; coating a second conductive material having a predetermined thickness for the charge storage electrode on the entire surface of the resulting structure, and subjecting the second conductive material for the charge storage electrode to etching so as to form a charge storage electrode having dual structure and a predetermined size, the second conductive material for the charge storage electrode coming into contact with the first conductive material for the charge storage electrode, In accordance with another aspect of the present invention, the above objects can be also achieved by providing a method for constructing a charge storage electrode of a semiconductor memory device wherein a gate electrode atop a gate oxide film is formed over a semiconductor substrate sectioned by a device separation insulating film which semiconductor substrate has, therein, a source electrode and a drain electrode that are to be connected with a charge storage electrode and a bit line, respectively, this method comprising the steps of: forming an interlayer insulating film, a sacrificial film and a first conductive material for the charge storage electrode entirely over the gate electrode and the resulting semiconductor substrate, in due order, the first conductive material for the charge storage electrode overlaying the sacrificial film atop the interlayer insulating film; applying a selective etching to the first conductive material for the charge conductive electrode, the sacrificial film and the interlayer insulating film with the aid of a contact mask for the charge storage electrode, so as to form, on a predetermined portion of the source electrode, a contact hole for the charge storage electrode exposing the source electrode therethrough; forming a spacer insulating film at the side wall of the contact hole for the charge storage electrode, so as to reduce the size of the contact hole; forming a second conductive material for charge storage electrode on the first conductive material for the charge storage electrode and into the contact hole, the second conductive material for the charge storage electrode being connected with the source electrode through the contact hole for the charge storage electrode; applying an etching to the second conductive material for the charge storage electrode and to the first conductive material for the charge storage electrode to pattern both the second conductive material for the charge storage electrode and the first conductive material for the charge storage electrode on a shape with the aid of a mask for the charge storage electrode; etching the sacrificial film, completely; coating a third conductive material for the charge storage electrode having a predetermined thickness on the entire surface of the resulting structure, and subjecting the third conductive material for the charge storage electrode to etching, so as to form a charge storage electrode having triple structure in a predetermined size, the first conductive material for the charge storage electrode, the second conductive material for the charge storage electrode and the third conductive material for the charge storage electrode coming into contact with one another.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

DETAILED DESCRIPTION OF THE PREFERRED EMBODIMENTS

Figure 1A:
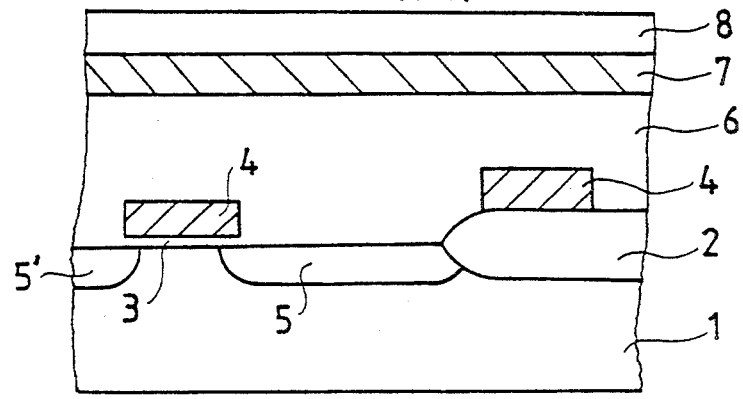
FIGS. 1A through 1C are schematic cross-sectional views illustrating one prior art method for constructing a charge storage electrode of dual structure.
Figure 1B:
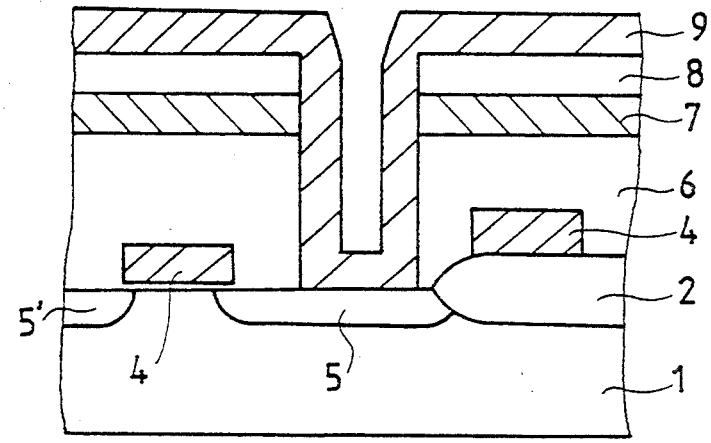
Figure 1C:
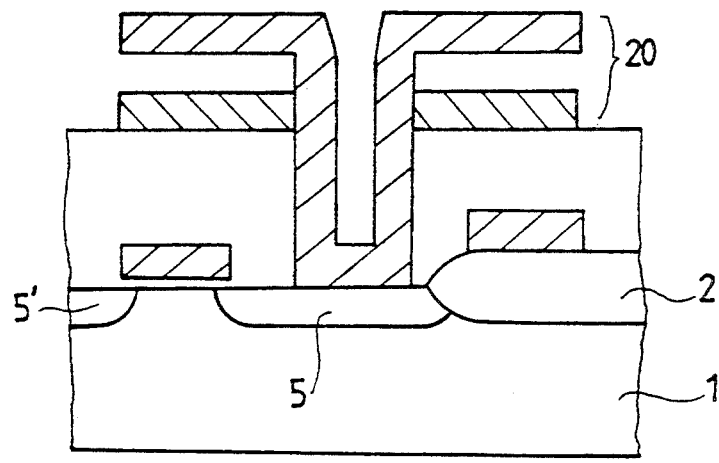
Figure 2A:
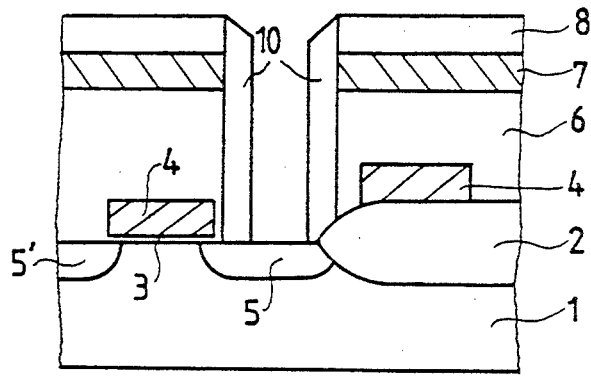
FIGS. 2A through 2C are schematic cross-sectional views illustrating another conventional method for constructing a charge storage electrode having a spacer insulating film.
Figure 2B:
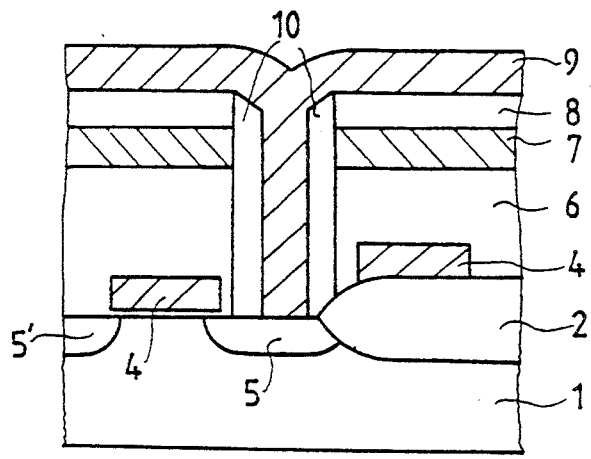
Figure 2C:
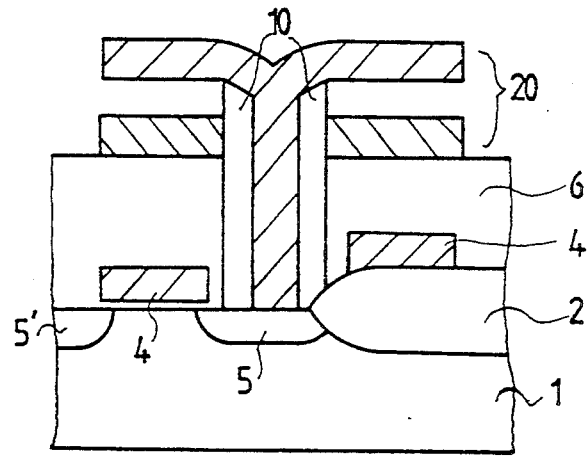

Hereinafter, the preferred embodiments of the present invention will be, in detail, described by reference to some drawings, wherein like reference numerals designate like parts, respectively.

Firstly, referring to FIGS. 3A through 3D, there are cross-sectional views illustrating construction processes for a dual charge storage electrode having a spacer insulating film formed at the side wall of a contact for the charge storage electrode, according to a first embodiment of the present invention. As shown in these figures, the charge storage electrode is constructed in such a way that the spacer insulating film is formed at the side wall of the contact for the charge storage electrode to separate the resulting contact for the charge storage electrode from the gate electrodes by a predetermined distance, thereby reducing the area of the resulting contact. Moreover a first conductive material for the charge storage electrode comes into contact with a second conductive material for the charge storage electrode, thereby allowing the resulting charge storage electrode to have a dual structure. The constructed charge storage electrode has a thickness which is twice the thickness of the second conductive material for charge storage electrode and wider than a mask used for etching the charge storage electrode.

In order to give a full detail of the first embodiment of the present invention, the figures are to be referred to, individually.

Figure 3A:
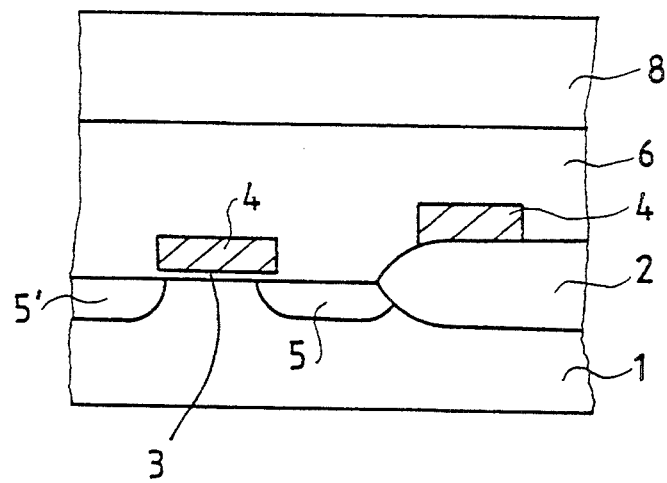
FIGS. 3A through 3D are schematic cross-sectional views illustrating a method for constructing a charge storage electrode of dual structure, having a spacer insulating film, according to a first embodiment of the present invention.

Initially, as shown in FIG. 3A, a semiconductor substrate 1 is sectioned into an active region and a device separation region by means of a device separation insulating film 2 and then, a gate oxide film 3 is formed over the active region. A gate electrode 4 is formed on the gate oxide film 3 and the device separation insulating film 2, respectively. Over the resulting structure, there is entirely formed an interlayer insulating film 6 having a thickness, which is subsequently coated with a sacrificial film 8 that is twice as thick as a second conductive material for the charge storage electrode to be formed later.

The sacrificial film 8 employed in the present invention is selected from those that have high etching selection ratio values to the upper material of the interlayer insulating film 6 as well as to a spacer insulating film to be formed later. For example, when both the interlayer film 6 and the spacer insulating film employ a USG film, the sacrificial film 8 may be selected from the group consisting of a PSG film and a BPSG film. The etching selection ratio of PSG film (or BPSG film) to USG film is greater than 10:1 in a solution containing HF and $H_2O$ or in a solution containing $NH_4OH$, $H_2O_2$ and $H_2O$. In case the interlayer insulating film 6 has a dual structure consisting of USG and BPSG at its upper and lower portions, respectively, the sacrificial film may be formed of PSG or BPSG, to obtain a great etching selection ratio.

Figure 3B:
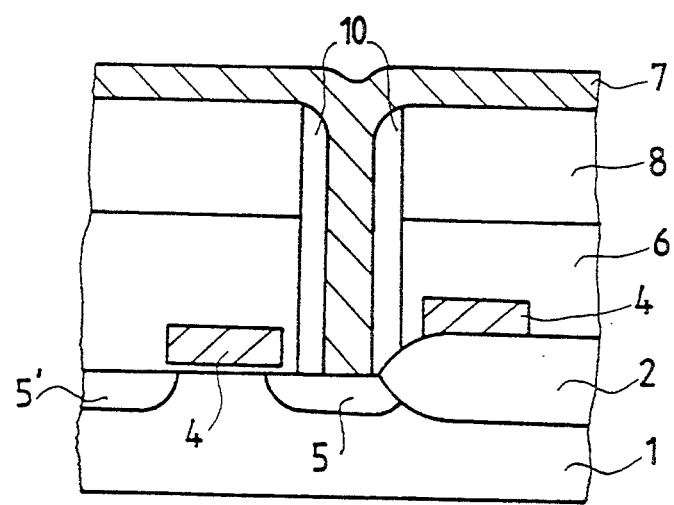

As shown in FIG. 3B, using a contact mask for the charge storage electrode (not shown), an etching process is applied to the sacrificial film 8 and the interlayer insulating film 6, in order to form a contact hole for the charge storage electrode on a predetermined portion of the source electrode 5. Following this, a spacer insulating film 10 is formed at the side wall of the contact hole for the charge storage electrode. Thereafter, a second conductive material for the charge storage electrode 9 is formed over the sacrificial film 8 and in the contact hole, being connected with the source electrode 5.

The spacer insulating film 10 serves not only to reduce the size of the contact for the charge storage electrode, but also to make the contact for the charge storage electrode be spaced apart from the gate electrodes by a predetermined distance, attributing to diminishing the area of the cell. Thus, the cell 1 area of semiconductor memory device can be reduced. That is to say, when the contact for the charge storage electrode is formed by use of the contact mask of the charge storage electrode, it may be positioned on or near by the gate electrode, but the side wall of the contact for the charge storage electrode comes to be separated from the gate electrode by a predetermined distance by the spacer insulating film formed thereat.

When the predetermined region passing through the sacrificial film 8 and the interlayer insulating film 6 above the source electrode 5 is subjected to the treatment of etching, the interlayer insulating film 6 atop the source electrode 5 may be left thin, the thin film being completely removed on forming the spacer insulating film 10, thereby minimizing the damage that may be generated at the surface of the source electrode 5.

Figure 3C:
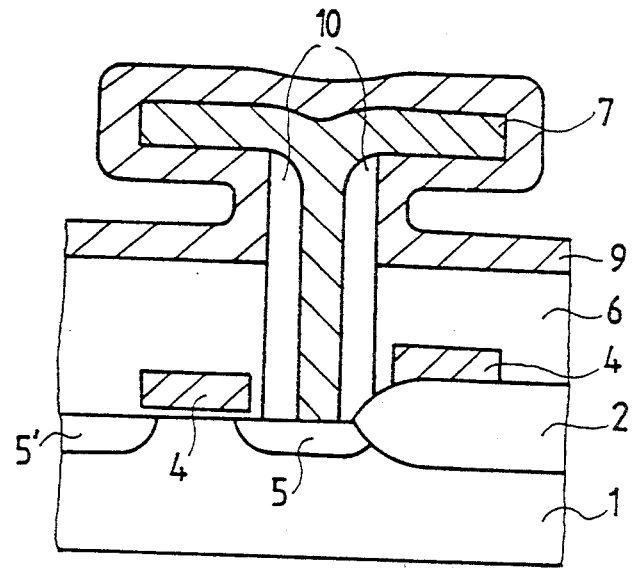

As shown in FIG. 3C, using a mask for the charge storage electrode (not shown), there is patterned the first conductive material for charge storage electrode 7, which subsequently serves as an etching barrier along with the interlayer insulating film 6 and the spacer insulating film 10 when an etching process is applied to remove the sacrificial film 8. After removing the sacrificial film 8, the resulting structure is entirely covered with a second conductive material for charge storage electrode 9 having a predetermined thickness. At this time, the second conductive material for the charge storage electrode 9 has to have a thickness which is less than half of the thickness of the sacrificial film 8, so that the second conductive material for charge storage electrode 9 formed on the lower surface of the first conductive material for charge storage electrode 7 is spaced from the interlayer insulating film 6 by a predetermined distance.

Figure 3D:
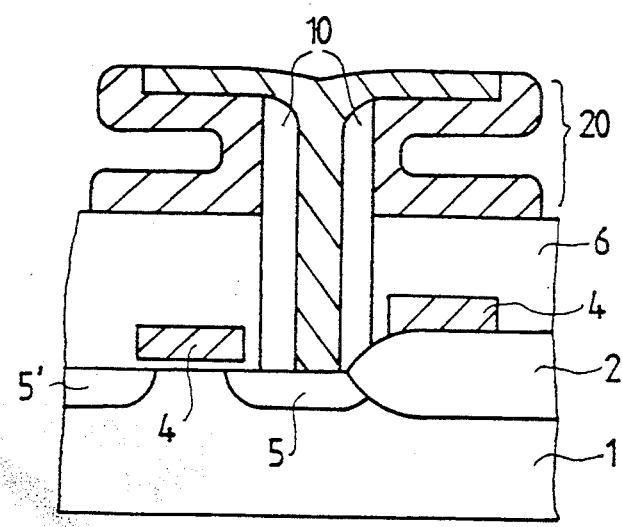

Finally, as shown in FIG. 3D, the second conductive material for charge storage electrode 9 is subjected to the treatment of etching, so as to form a charge storage electrode having a dual structure, in which the first conductive material for charge storage electrode 7 is connected with the second conductive material for charge storage electrode 9 and which is connected with the source electrode 5.

According to the first embodiment of the present invention, the charge storage electrode is constructed in such a way that the spacer insulating film is formed at the side wall of the contact for the charge storage electrode to separate the contact for the charge storage electrode from the gate electrode by a predetermined distance, thereby reducing the area of the contact, and further such that the first conductive material for the charge storage electrode comes into contact with the second conductive material for the charge storage electrode, thereby allowing the charge storage electrode to have a dual structure, and that the charge storage electrode has a thickness which is twice the thickness of the second conductive material for the charge storage electrode and wider than the mask used for etching the charge storage electrode, thereby enlarging the capacity of the semiconductor memory device. Consequently, the high integration of the semiconductor memory device can be accomplished, owing to the reduction in cell area and the increment in capacity, in accordance with the present invention.

Turning now to FIGS. 4A through 4D, there are cross-sectional views illustrating construction processes for a triple charge storage electrode having a spacer insulating film formed at the side wall of a contact for the charge storage electrode, according to a second embodiment of the present invention. As shown in these figures, the charge storage electrode is constructed in such a way that the spacer insulating film is formed at the side wall of the contact for the charge storage electrode to separate the resulting contact for the charge storage electrode from the gate electrode by a predetermined distance, thereby reducing the area of the resulting contact. A first conductive material for the charge storage electrode, a second conductive material for the charge storage electrode and a third conductive material for the charge storage electrode are interconnected with one another, thereby allowing the charge storage electrode to have a triple structure. The constructed charge storage electrode is the double thickness of the third conductive material for the charge storage electrode and wider than a mask for the charge storage electrode.

In order to give a full detail of the second embodiment of the present invention, the figures are to be referred to, individually.

Figure 4A:
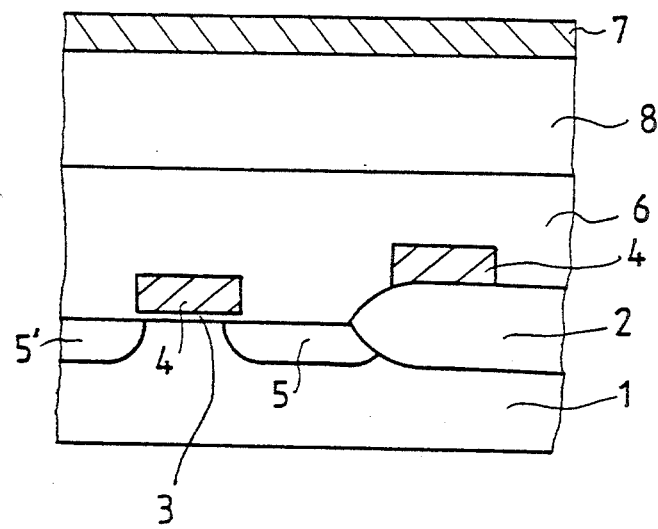
FIGS. 4A through 4D are schematic cross-sectional views illustrating a method for constructing a charge storage electrode of triple structure, having a spacer insulating film, according to a second embodiment of the present invention.

Initially, as shown in FIG. 4A, a semiconductor substrate 1 sectioned into an active region and a device separation region by means of a device separation insulating film 2 and then, a gate oxide film 3 is formed over the active region. A gate electrode 4 are formed on the active region and the device separation insulating film, respectively. Over the resulting structure, there is entirely formed an interlayer insulating film 6 having a thickness, which film is subsequently coated with a sacrificial film 8 that is twice as thick as a second conductive material for the charge storage electrode to be formed later. Thereafter, a first conductive material for the charge storage electrode 7 overlays the sacrificial film 8.

The sacrificial film 8 employed in the present invention is selected from those that have high etching selection ratio values in relation to the upper material of the interlayer insulating film 6 as well as to a spacer insulating film to be formed later. For example, when both the interlayer film 6 and the spacer insulating film employ a USG film, the sacrificial film 8 may be selected from the group consisting of a PSG film and a BPSG film. The etching selection ratio of PSG film (or BPSG film) to USG film is greater than 10:1 in a solution containing HF and $H_2O$ or in a solution containing $NH_4OH$, $H_2O_2$ and $H_2O$. In case the interlayer insulating film 6 is formed into a dual structure consisting of USG and BPSG at its upper and lower portions, respectively, the sacrificial film may be formed of PSG or BPSG, so as to obtain a great etching selection ratio.

Figure 4B:
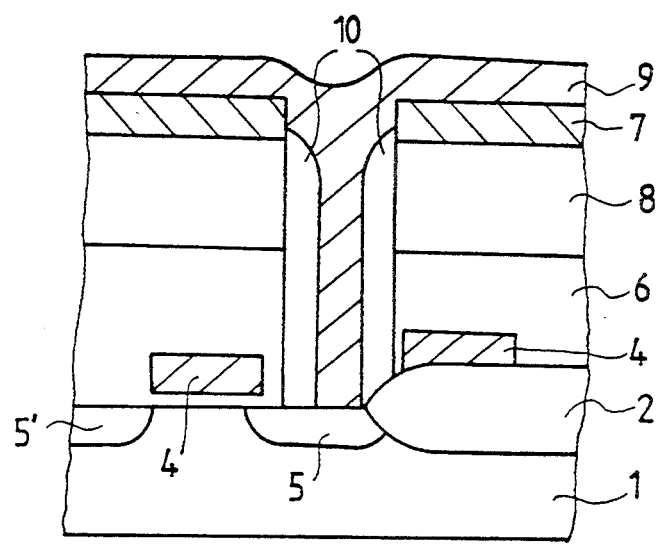

As shown in FIG. 4B, using a contact mask for etching the charge storage electrode (not shown), an etching process is applied to the first conductive material for charge storage electrode 7, the sacrificial film 8 and the interlayer insulating film 6, in due order, in order to form a contact hole for the charge storage electrode on a predetermined portion of the source electrode 5. Following this, a spacer insulating film 10 is formed at the side wall of the contact hole for the charge storage electrode. Thereafter, a second conductive material for charge storage electrode 9 is formed over sacrificial film 8 and in the contact hole, being connected with the source electrode 5.

The spacer insulating film 10 serves not only to reduce the size of the contact for the charge storage electrode, but also to make the contact for the charge storage electrode be spaced apart from the gate electrodes by a predetermined distance, thus attributing to diminish the area of the cell. Thus, the cell area of the semiconductor memory device can be reduced. That is to say, when the contact for the charge storage electrode is formed by use of the contact mask of the charge storage electrode, it may be positioned on or near by the gate electrode, but the side wall of the contact for the charge storage electrode comes to be separated from the gate electrode by a predetermined distance by the spacer insulating film formed thereat.

When the predetermined region passing through the first conductive film 7 for the charge storage electrode, the sacrificial film 8 and the interlayer insulating film 6 above the source electrode 5 are subjected to the treatment of etching, the interlayer insulating film 6 atop the source electrode 5 may be left thin, which thin film is completely removed on forming the spacer insulating film 10, thereby minimizing the damage that may be generated at the surface of the source electrode 5.

Figure 4C:
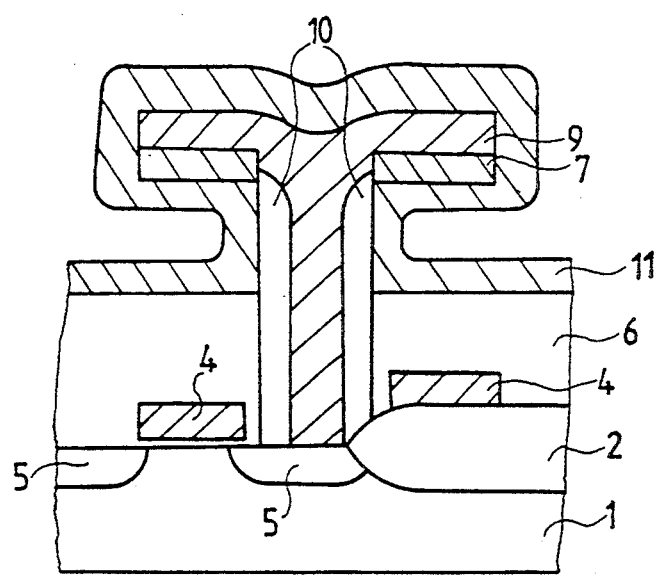

As shown in FIG. 4C, using a mask (not shown) for the charge storage electrode a pattern is provided for the first conductive material for charge storage electrode 7 and the second conductive material for charge storage electrode 9, which, along with the interlayer insulating film 6 and the spacer insulating film 10, subsequently serve as an etching barrier when an etching process is applied to remove the sacrificial film 8. After etching the sacrificial film 8, the resulting structure is entirely covered with a third conductive material 11 for the charge storage electrode in a predetermined thickness. At this time, the third conductive material 11 for the charge storage electrode has to have a thickness which is less than the half of the thickness of the sacrificial film 8, so that a first portion of the third conductive material 11 for the charge storage electrode formed on the first conductive material for the charge storage electrode 7 is spaced apart from a second portion of the third conductive material 11 formed on the interlayer insulating film 6 by a predetermined distance.

Figure 4D:
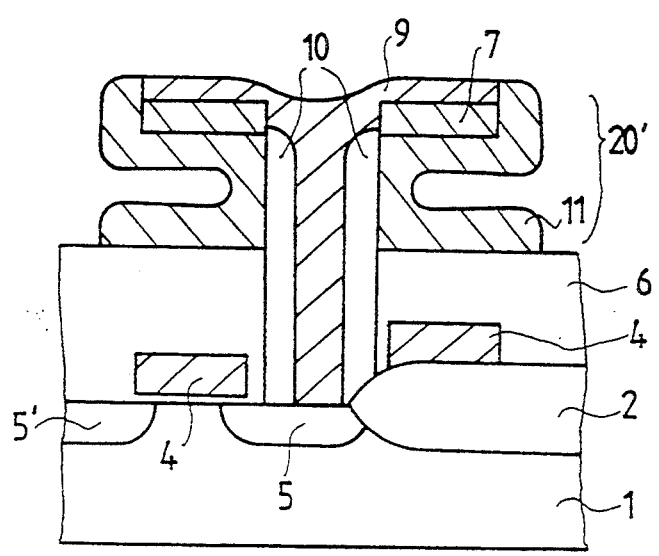

Finally, as shown in FIG. 4D, the third conductive material 11 for the charge storage electrode is subjected to the treatment of etching, so as to form a triple charge storage electrode 20', consisting of the first conductive material 7, the second conductive material 9 and the third conductive material 11 for the charge storage electrode which come into contact with one another, thus forming a triple structure, and which are connected with the source electrode 5.

As described hereinbefore, even when the contact mask for charge storage electrode is manufactured with no consideration of the distance between the contact for charge storage electrode and the gate electrode, the contact for the charge storage electrode formed with the contact mask can be reduced in size by the formation of the spacer insulating film at the side wall thereof, in accordance with the present invention. The formation of the spacer insulating film brings about effects such as security of the predetermined distance between the gate electrode and the resulting contact and reduction in cell area of the semiconductor memory device. In addition, since the charge storage electrode is constructed in such a way to have dual or triple structure, the distance between neighboring charge storage electrodes can be shorter than the minimal size acquirable with a present photo developing technique, resulting in maximizing the size of the charge storage electrode constructed.

Therefore, the capacity of the semiconductor memory device is maximized, accomplishing the high integration of the semiconductor memory device consequently, in accordance with the present invention.

What is claimed is:

1. A method for constructing a charge storage electrode of a semiconductor memory device wherein a gate electrode atop a gate oxide film is formed over a semiconductor substrate sectioned by a device separation insulating film, the semiconductor substrate having therein a source electrode and a drain electrode that are to be connected with a charge storage electrode and a bit line, respectively, comprising the steps of:

forming an interlayer insulating film covered with a sacrificial film entirely over the gate electrode and the semiconductor substrate;

selectively etching the sacrificial film and the interlayer insulating film using a contact mask for the charge storage electrode so as to form on a portion of the source electrode a contact hole for the charge storage electrode exposing the source electrode therethrough;

forming a spacer insulating film at side walls of the contact hole for the charge storage electrode, so as to reduce the size of the contact hole;

forming a first conductive material for the charge storage electrode on the sacrificial film and in the contact hole, the first conductive material for the charge storage electrode being connected with the source electrode through the contact hole for the charge storage electrode;

etching the first conductive material for the charge storage electrode to pattern the first conductive material for the charge storage electrode with the aid of a mask for the charge storage electrode;

etching the sacrificial film completely;

coating a second conductive material for the charge storage electrode on an entire surface of a structure resulting from the preceding steps; and subjecting the second conductive material for the charge storage electrode to etching, so as to form a charge storage electrode having a dual structure the second conductive material for the charge storage electrode coming into contact with the first conductive material for the charge storage electrode.

2. A method according to claim 1, wherein the sacrificial film formed on the interlayer insulating film is at least twice as thick as the second conductive material for the charge storage electrode.

3. A method according to claim 1, wherein the sacrificial film has a greater etching selection ratio value than both the spacer insulating film and the interlayer insulating film.

4. A method according to claim 3, wherein the sacrificial film is selected from the group consisting of a phospho-silicate glass film and a boro-phospho-silicate glass film.

5. A method according to claim 3, wherein the spacer insulating film formed at the side walls of the contact hole for the charge storage electrode is an undoped silicate glass film.

6. A method for constructing a charge storage electrode of a semiconductor memory device wherein a gate electrode atop a gate oxide film is formed over a semiconductor substrate sectioned by a device separation insulating film, the semiconductor substrate having therein a source electrode and a drain electrode that are to be connected with a charge storage electrode and a bit line, respectively, comprising the steps of:

forming an interlayer insulating film covered with a sacrificial film entirely over the gate electrode and the semiconductor substrate;

selectively etching the sacrificial film and the interlayer insulating film using a contact mask for the charge storage electrode so as to form a pre-contact hole for the charge storage electrode above a portion of the source electrode, a portion of the interlayer insulating film being left in the pre-contact hole for the charge storage electrode;

filling the pre-contact hole for the charge storage electrode with an insulating film;

subsequently subjecting the insulating film to etching along with the portion of the interlayer insulating film left in the pre-contact hole so as to form both a space insulating film and a contact hole for the charge storage electrode exposing the source electrode therethrough, said insulating film forming side walls of the contact hole;

forming a first conductive material for the charge storage electrode on the sacrificial film and in the contact hole, the first conductive material for the charge storage electrode being connected with the source electrode through the contact for the charge storage electrode;

etching the first conductive material for the charge storage electrode to pattern the first conductive material for the charge storage electrode with the aid of a mask for the charge storage electrode;

etching the sacrificial film completely;

coating a second conductive material for the charge storage electrode on an entire surface of a structure resulting from the steps above; and subjecting the second conductive material for the charge storage electrode to etching, so as to form a charge storage electrode having a dual structure the second conductive material for the charge storage electrode coming into contact with the first conductive material for the charge storage electrode.

7. A method according to claim 6, wherein the sacrificial film formed on the interlayer insulating film is at least twice as thick as the second conductive material for the charge storage electrode.

8. A method according to claim 6, wherein the sacrificial film has a greater etching selection ratio value than both the spacer insulating film and the interlayer insulating film.

9. A method according to claim 8, wherein the sacrificial film is selected from the group consisting of a phospho-silicate glass film and a boro-phospho-silicate glass film.

10. A method according to claim 8, wherein the spacer insulating film, which form side walls of the contact hole for the charge storage electrode, is an undoped silicate glass film.

11. A method for constructing a charge storage electrode of a semiconductor memory device wherein a gate electrode atop a gate oxide film is formed over a semiconductor substrate sectioned by a device separation insulating film, the semiconductor substrate having therein a source electrode and a drain electrode that are to be connected with a charge storage electrode and a bit line, respectively, comprising the steps of:

forming an interlayer insulating film, a sacrificial film and a first conductive material for the charge storage electrode entirely over the gate electrode and the semiconductor substrate, in due order, the first conductive material for the charge storage electrode overlaying the sacrificial film atop the interlayer insulating film;

selectively etching the first conductive material for the charge conductive electrode, the sacrificial film and the interlayer insulating film using a contact mask for the charge storage electrode, so as to form on a portion of the source electrode a contact hole for the charge storage electrode exposing the source electrode therethrough;

forming a spacer insulating film at side walls of the contact hole for the charge storage electrode, so as to reduce the contact hole size;

forming a second conductive material for the charge storage electrode on the first conductive material for the charge storage electrode and in the contact hole, the second conductive material for the charge storage electrode being connected with the source electrode through the contact hole for the charge storage electrode;

etching the second conductive material for the charge storage electrode and the first conductive material for the charge storage electrode to pattern both the second conductive material for the charge storage electrode and the first conductive material for the charge electrode using a mask for the charge storage electrode;

etching the sacrificial film completely;

coating a third conductive material for the charge storage electrode having a on an entire surface of a structure resulting from the steps above; and subjecting the third consecutive material for the charge storage electrode to etching, so as to form a charge storage electrode having a triple structure the first conductive material for the charge storage electrode, the second conductive material for the charge storage electrode and the third conductive material for the charge storage electrode coming into contact with one another.

12. A method according to claim 11, wherein the sacrificial film formed on the interlayer insulating film is at least twice as thick as the second conductive material for the charge storage electrode.

13. A method according to claim 11, wherein the sacrificial film has a greater etching selection ratio value than both the spacer insulating film and the interlayer insulating film.

14. A method according to claim 13, wherein the sacrificial film is selected from the group consisting of a phospho-silicate glass film and a boro-phospho-silicate glass film.

15. A method according to claim 13, wherein the spacer insulating film formed at side walls of the contact hole for the charge storage electrode is an undoped silicate glass film.

16. A method for constructing a charge storage electrode of a semiconductor memory device wherein a gate electrode atop a gate oxide film is formed over a semiconductor substrate sectioned by a device separation insulating film, the semiconductor substrate having therein a source electrode and a drain electrode that are to be connected with a charge storage electrode and a bit line, respectively, comprising the steps of:

forming an interlayer insulating film, a sacrificial film and a first conductive material for the charge storage electrode entirely over the gate electrode and the semiconductor substrate, in due order, the first conductive material for the charge storage electrode overlaying the sacrificial film atop the interlayer insulating film;

selectively etching the first conductive material for the charge storage electrode, the sacrificial film, and the interlayer insulating film using a contact mask for the charge storage electrode, so as to form a pre-contact hole for the charge storage electrode above a portion of the source electrode, a portion of the interlayer insulating film being left in the pre-contact hole for the charge storage electrode;

filling the pre-contact hole for the charge storage electrode with an insulating film;

subsequently subjecting the insulating film to etching along with the portion of the interlayer insulating film left in the pre-contact hole so as to form both a spacer insulating film and a contact hole for the charge storage electrode exposing the source electrode therethrough, said insulating film forming side walls of the contact hole;

forming a second conductive material for the charge storage electrode on the first conductive material for the charge storage electrode and in the contact hole, the second conductive material for the charge storage electrode being connected with the source electrode through the contact hole for the charge storage electrode;

etching the second conductive material for the charge storage electrode and the first conductive material for the charge storage electrode to pattern both the second conductive material for the charge storage electrode and the first conductive material for the charge storage electrode using a mask for the charge storage electrode;

etching the sacrificial film completely;

coating a third conductive material for the charge storage electrode on the entire surface of a structure resulting from the steps above; and subjecting the third conductive material for the charge storage electrode to etching, so as to form a charge storage electrode having a triple structure the first conductive material for the charge storage electrode, the second conductive material for the charge storage electrode and the third conductive material for the charge storage electrode coming into contact with one another.

17. A method according to claim 16, wherein the sacrificial film formed on the interlayer insulating film is at least twice as thick as the second conductive material for the charge storage electrode.

18. A method according to claim 16, wherein said sacrificial film has a greater etching selection ratio value than both the spacer insulating film and than interlayer insulating film.

19. A method according to claim 18, wherein the sacrificial film is selected from the group consisting of a phospho-silicate glass film and a boro-phospho-silicate glass film.

20. A method according to claim 3, wherein the spacer insulating film, which forms side walls of the contact hole for the charge storage electrode, is an undoped silicate glass film.

* * * * *